(12) United States Patent
Van Buel et al.

(10) Patent No.: US 7,253,884 B2
(45) Date of Patent: Aug. 7, 2007

(54) METHOD OF CALIBRATING A LITHOGRAPHIC APPARATUS, ALIGNMENT METHOD, COMPUTER PROGRAM, DATA STORAGE MEDIUM, LITHOGRAPHIC APPARATUS, AND DEVICE MANUFACTURING METHOD

(75) Inventors: Henricus Wilhelmus Maria Van Buel, Eindhoven (NL); Cheng-Qun Gui, Best (NL); Alex De Vries, Meerlo (NL)

(73) Assignee: ASML Netherlands B.V., Veldhoven (NL)

( * ) Notice: Subject to any disclaimer, the term of this patent is extended or adjusted under 35 U.S.C. 154(b) by 114 days.

(21) Appl. No.: 10/845,521

(22) Filed: May 14, 2004

(65) Prior Publication Data

US 2005/0018159 A1 Jan. 27, 2005

(30) Foreign Application Priority Data

May 16, 2003 (EP) .................... 03253058

(51) Int. Cl.
 G03B 27/32 (2006.01)
 G03B 27/68 (2006.01)
(52) U.S. Cl. .......................... 355/77; 355/52
(58) Field of Classification Search ........... 355/52, 355/53, 77; 356/20, 21, 22, 399, 400, 401
 See application file for complete search history.

(56) References Cited

U.S. PATENT DOCUMENTS

| | | | |
|---|---|---|---|
| 4,952,060 A | 8/1990 | Ina et al. | |
| 5,229,872 A | 7/1993 | Mumola | |
| 5,296,891 A | 3/1994 | Vogt et al. | |
| 5,361,132 A * | 11/1994 | Farn | ............... 356/509 |
| 5,523,193 A | 6/1996 | Nelson | |
| 5,929,997 A * | 7/1999 | Lin | ............... 356/401 |
| 5,969,441 A | 10/1999 | Loopstra et al. | |
| 6,046,792 A | 4/2000 | Van Der Werf et al. | |
| 6,117,599 A * | 9/2000 | Lin | ............... 430/22 |
| 6,198,535 B1 * | 3/2001 | Hu et al. | ............... 356/401 |
| 6,376,329 B1 * | 4/2002 | Sogard et al. | ............... 438/401 |
| 6,525,805 B2 * | 2/2003 | Heinle | ............... 355/53 |

(Continued)

FOREIGN PATENT DOCUMENTS

EP 02251440 3/2002

(Continued)

OTHER PUBLICATIONS

Search Report for European Application No. 03253058.6, dated Mar. 8, 2004.

(Continued)

*Primary Examiner*—Rodney Fuller
(74) *Attorney, Agent, or Firm*—Pillsbury Winthrop Shaw Pittman, LLP

(57) ABSTRACT

In one method of compensating for the distortion of front-to-backside alignment optics, a displacement vector between the estimated position of a substrate mark and the actual position of a substrate mark is calculated. An optical correction array is also calculated by moving a reference substrate by a fixed amount and comparing how far an image of a point on the back side of a reference substrate moves to how far a corresponding point on the front side of the substrate moves. The displacement vector and optical correction array may then be used to accurately calculate the position of further substrates.

24 Claims, 4 Drawing Sheets

U.S. PATENT DOCUMENTS

| | | |
|---|---|---|
| 6,861,186 B1 * | 3/2005 | Pagette et al. ............... 430/22 |
| 6,898,306 B1 * | 5/2005 | Lu ............................ 382/151 |
| 2002/0084565 A1 * | 7/2002 | Dautartas et al. ....... 269/289 R |
| 2002/0167649 A1 * | 11/2002 | Heinle ........................ 355/53 |

FOREIGN PATENT DOCUMENTS

| | | |
|---|---|---|
| EP | 1 223 469 A1 | 7/2002 |
| EP | 1 341 046 A2 | 9/2003 |
| EP | 1 341 046 A3 | 12/2004 |
| WO | 98/33096 | 7/1998 |
| WO | 98/38597 | 9/1998 |
| WO | 98/40791 | 9/1998 |

OTHER PUBLICATIONS

Bijnen, et al., "Front to Back Alignment Metrology", Emerging Lithographic Technologies VII, Proceedings of SPIE vol. 5037 (2003) pp. 641-646.

European Search Report issued for European Patent Application No. 04252825.7-2222, dated Jun. 1, 2006.

* cited by examiner

METHOD OF CALIBRATING A LITHOGRAPHIC APPARATUS, ALIGNMENT METHOD, COMPUTER PROGRAM, DATA STORAGE MEDIUM, LITHOGRAPHIC APPARATUS, AND DEVICE MANUFACTURING METHOD

RELATED APPLICATIONS

This Application claims benefit of European Patent Application No. 03253058.6, filed May 16, 2003, which document is hereby incorporated by reference.

FIELD OF THE INVENTION

The present invention relates to alignment operations in lithographic apparatus.

DISCUSSION OF RELATED ART

The term "patterning structure" as here employed should be broadly interpreted as referring to structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation structure. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic structure. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging operation, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory operations may be carried out on one or more tables while one or more other tables are being used for exposures. Dual stage lithographic apparatus are described, for example, in U.S. Pat. No. 5,969,441 and Published PCT Application WO 98/40791, incorporated herein by reference.

Before exposing the substrate, it should be correctly aligned to ensure accurate projection of the functional features. A mark is provided on the substrate and detected with an alignment system. Examples of alignment systems are a conventional through-the-lens alignment system and also the alignment methods and apparatus described in co-pending European Patent Applications EP02251440 and EP02250235. The mark is commonly on the front side of the substrate, but can also be on the back side of the substrate. Marks on the back side of the substrate are used particularly in the manufacture of Micro Electro Mechanical Systems (MEMS) or Micro Opto-Electro Mechanical Systems (MOEMS).

If marks on the back side of a substrate are used, front-to-backside alignment (FTBA) optics project the mark on the back side of the substrate to the front side. Alternatively, if the marks on the front side of the substrate are no longer usable (due to, for example, chemical mechanical polishing, epitaxial layer deposition or thick grainy metal layer deposition), back-to-backside alignment (BTBA) optics can be used. As there is little space for the FTBA and BTBA optics, simple optics, such as mirrors embedded in the substrate table are used. While the advantage is that these optics are cheap, the consequent disadvantage is that the optics have a low accuracy and distortion, and displacement of the image of the mark is therefore common. This distortion and displacement also depends on the position of the mark on the substrate.

This distortion can be compensated for by calculating displacement vectors (e.g. image-to-object or ITO vectors) between actual positions of the substrate and estimated positions of the substrate mark for each point using, for example, a reference substrate. To calculate such displacement vectors the reference substrate should have marks on both the front and back side, although the marks need not have a direct correspondence. However, this method may be difficult to implement due to the large number of ITO vectors involved. Additionally it may be difficult to determine each ITO vector accurately.

Present methods for calibrating front-to-backside alignment optics also assume that the characteristics of the front-to-backside alignment optics do not change significantly over time. If, for example, the position of the front-to-backside alignment optics within the substrate table changed, or the dimensions of the front-to-backside alignment optics changed over time, this would not be accounted for in present calibration methods, resulting in inaccurate alignment and inaccurate exposures. Furthermore the use of a calibration substrate may disturb the substrate throughput.

SUMMARY

A method of calibrating a lithographic apparatus according to one embodiment of the invention includes calculating a displacement vector between (1) a position of a mark on a back side of a reference substrate as observed through a front-to-backside alignment optics of the lithographic apparatus and (2) an actual position of said mark. The method also includes moving the reference substrate a small distance relative to said front-to-backside alignment optics and comparing a resulting displacement of an image of a point on the back side of the reference substrate to a resulting displacement of a point on the front side of the reference substrate to generate a first correction vector, and repeating the moving and comparing for a different point on the reference substrate to generate a second correction vector. The method includes applying calibration information based on the displacement vector and the optical correction vectors.

A method of calibrating a lithographic apparatus according to another embodiment of the invention includes, for each of a plurality of marks arranged to be observed through a single branch of said front-to-backside alignment optics of the lithographic apparatus, calculating a first displacement vector between (1) the mark and (2) an image of the mark observed in an image window of said front-to-backside alignment optics. For each of the plurality of marks, a second displacement vector is calculated between (1) the mark and (2) an image of the mark observed in an image window of said front-to-backside alignment optics subsequent to said calculating a first displacement vector. The method also includes comparing the first and second displacement vectors to detect a change in the front-to-backside alignment optics.

An alignment method according to an embodiment of the invention includes providing an alignment beam of radiation and providing an alignment system for projecting the alignment beam onto a substrate mark on the back side of a substrate and detecting said substrate mark. A position of the substrate mark is calculated using a displacement vector and a plurality of correction vectors.

A lithographic apparatus according to an embodiment of the invention includes a radiation system configured to provide a beam of radiation; a support structure configured to support patterning structure, the patterning structure serving to pattern the beam of radiation according to a desired pattern; a substrate table configured to hold a substrate; a projection system arranged to project the patterned beam onto a target portion of the substrate; an alignment system arranged to detect alignment between a reference mark and said substrate mark using an alignment beam of radiation and front-to-backside alignment optics; a storage device arranged to store a displacement vector and a plurality of correction vectors; and a correction device arranged to correct an alignment error of the substrate.

A lithographic projection apparatus according to another embodiment of the invention includes a radiation system configured to provide a beam of radiation; a support structure configured to support patterning structure, the patterning structure serving to pattern the beam of radiation according to a desired pattern; a substrate table configured to hold a substrate; a projection system arranged to project the patterned beam onto a target portion of the substrate; frontto-backside alignment optics arranged to project an image of the substrate mark to the front side of the substrate; and an alignment system arranged to detect alignment between a reference mark and the substrate mark using an alignment beam of radiation and the front-to-backside alignment optics. The front-to-backside alignment optics is configured to simultaneously project images of a plurality of marks including said substrate mark.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include an improved method of calculating the distortion of the substrate image.

Figure 1:
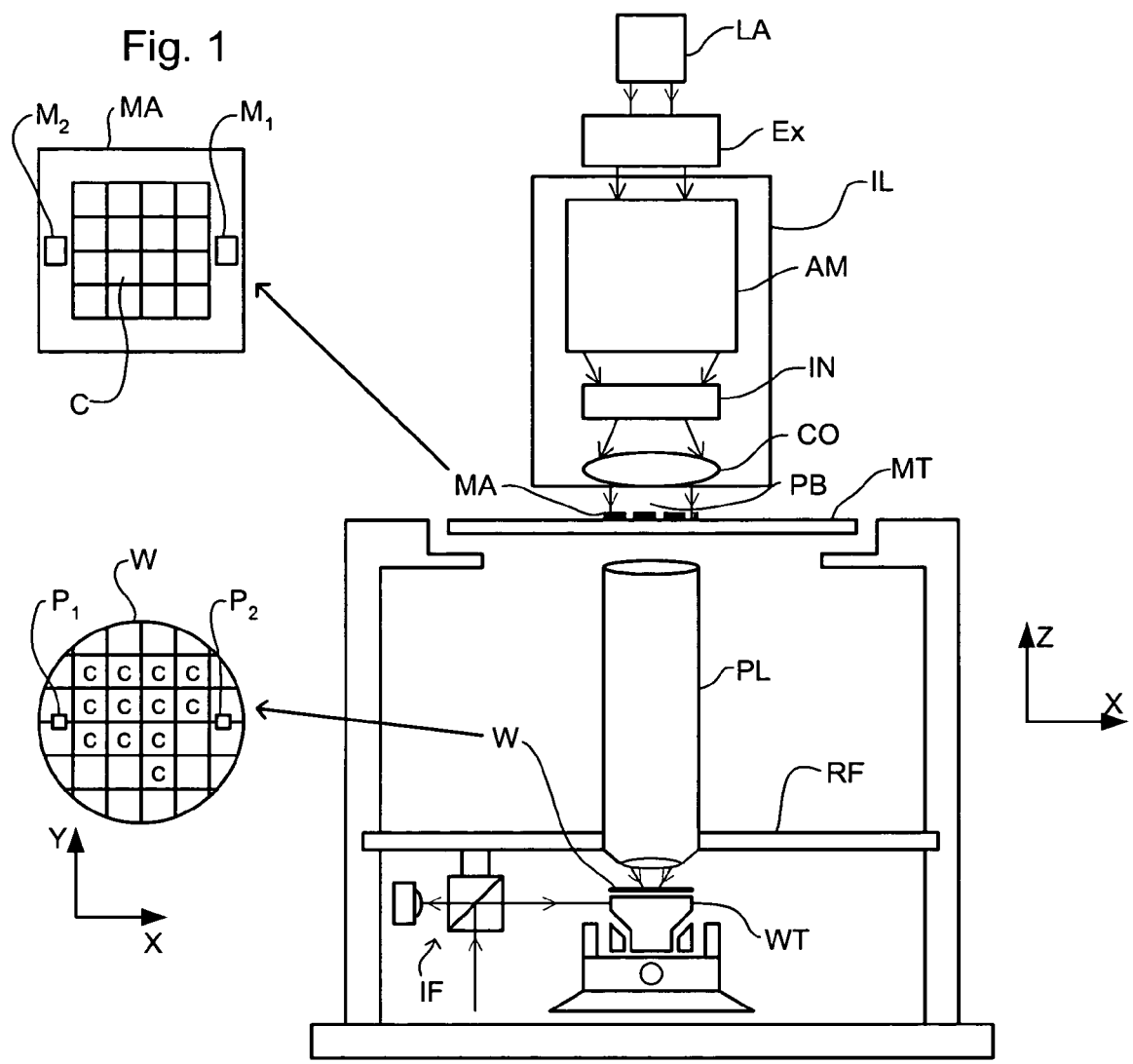
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. UV radiation), which in this particular case also comprises a radiation source LA;

a first object table (mask table) MT provided with a mask holder for holding a mask MA (e.g. a reticle), and connected to first positioning structure for accurately positioning the mask with respect to item PL;

a second object table (substrate table) WT provided with a substrate holder for holding a substrate W (e.g. a resist-coated silicon wafer), and connected to second positioning structure for accurately positioning the substrate with respect to item PL;

a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source LA (e.g. a laser-produced or discharge plasma source) produces a beam of radiation. This beam is fed into an illumination system (illuminator) IL, either directly or after having traversed conditioning structure, such as a beam expander Ex, for example. The illuminator IL may comprise adjusting structure AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
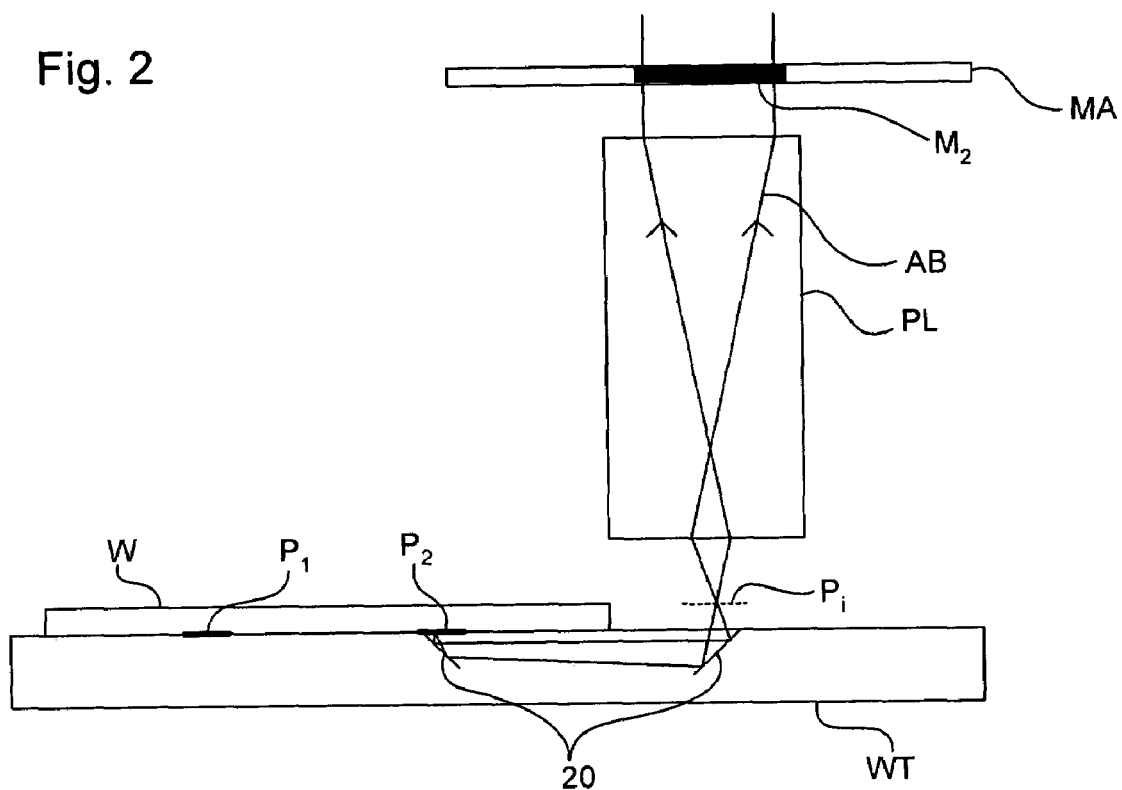
FIG. 2 is a diagram showing alignment of a substrate in a lithographic projection apparatus using front-to-backside alignment optics.
Figure 4A:
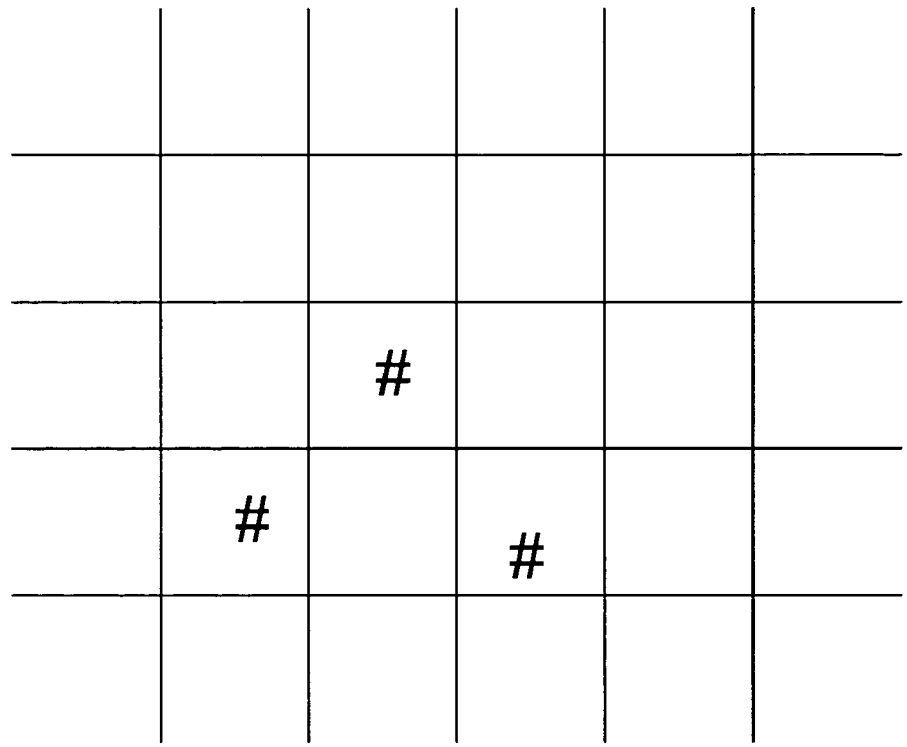
FIG. 4a shows a movement of marks on the front side of a reference substrate relative to an illustrative grid when calculating a correction vector.
Figure 4B:
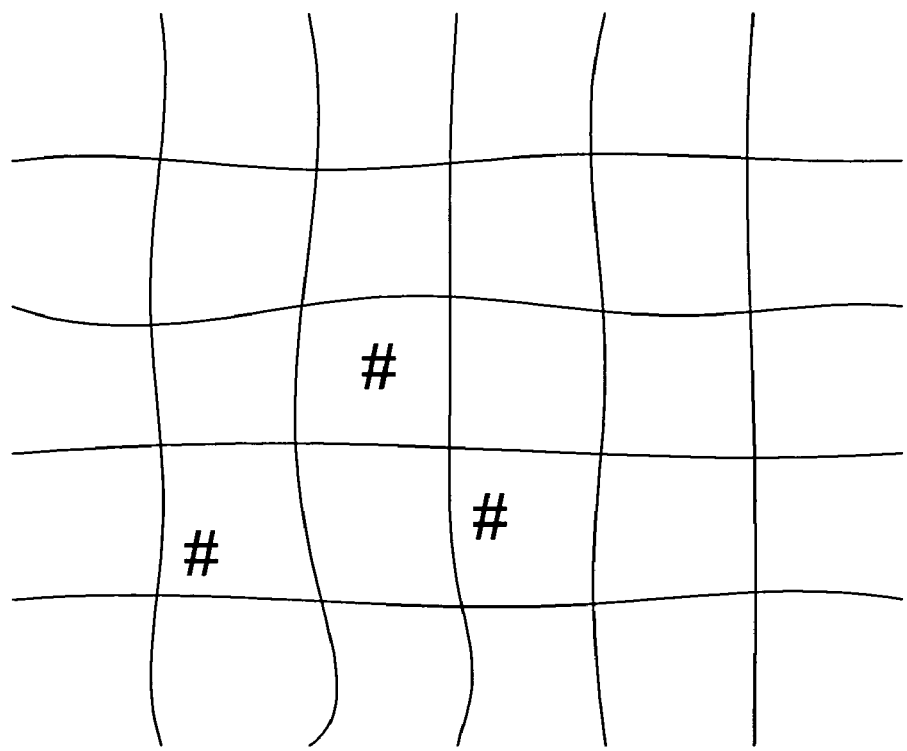
FIG. 4b shows a movement of marks on the back side of a reference substrate relative to an illustrative grid (which has also been projected through the front-to-backside alignment optics) when calculating a correction vector.

Prior to exposure of the substrate, alignment of the mask MA and substrate W takes place. Complementary alignment marks $M_1$, $M_2$ and substrate marks $P_1$, $P_2$ are present on the mask MA and substrate respectively. Embodiments of the invention may be practiced without requiring a new alignment system, and in FIG. 2 an alignment beam AB is projected through the projection system PL. As can be seen the substrate marks $P_1$ and $P_2$ are on the back surface of the substrate and so the substrate mark $P_2$ is re-imaged by the front-to-backside alignment optics 20 at the side of the substrate W to form an image $P_i$. In FIG. 4b a distortion of a grid projected through the front-to-backside alignment optics 20 is illustrated.

Figure 3:
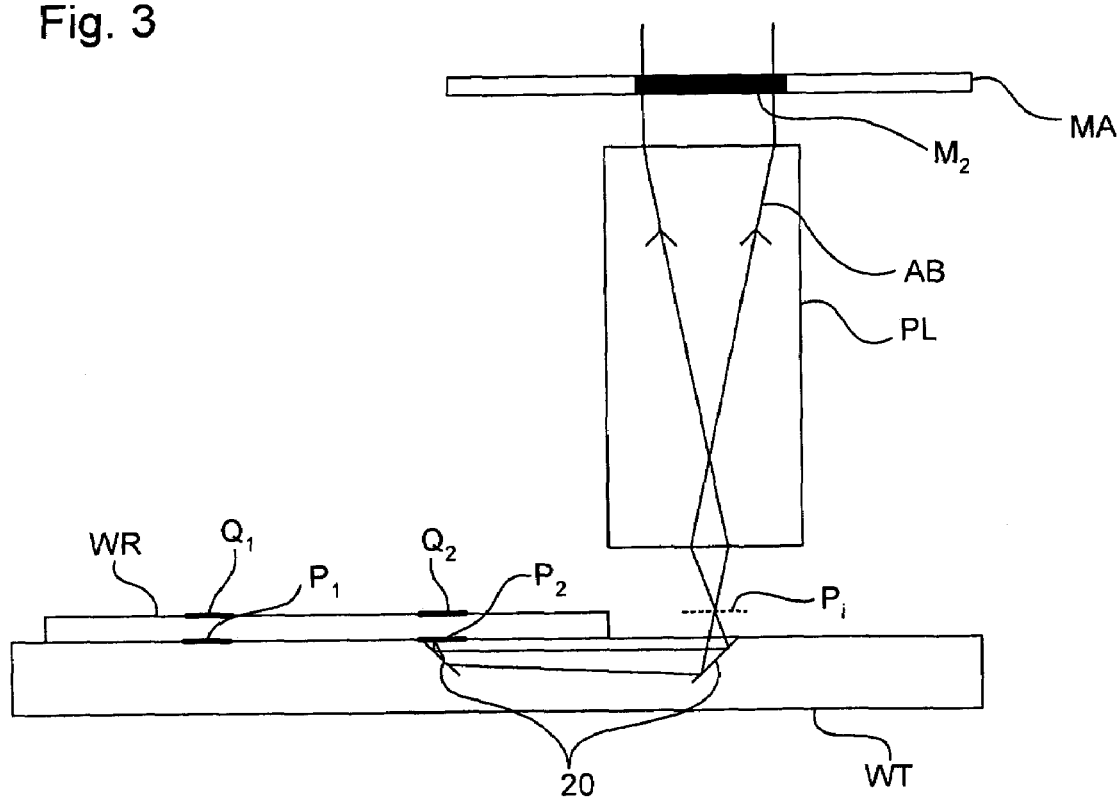
FIG. 3 is a diagram showing an apparatus as in FIG. 2 involved in calculation of a displacement vector and an optical correction array.

In FIG. 3 the apparatus involved in calculating a displacement vector and an optical correction array (made up from a plurality of optical correction vectors) used to describe and compensate for the distortion is shown. For this a specially designed substrate WR having substrate marks on both the front and back side is used. The position $P_2$ of a particular substrate mark $P_2$ on the back side of the reference substrate WR is known relative to the position $Q_2$ of a substrate mark $Q_2$ on the front side of the reference substrate WR. The alignment optics described in the paragraph above are used to project an image $P_{2i}$ of the substrate mark $P_2$ at position $P_{2i}$ within image $P_i$, and using alignment mark $M_2$ the position of $P_2$ can be estimated.

An image to object vector ITO is the distance between the image $P_{2i}$ and the mark $P_2$, and an optical correction vector (OCO) indicates the relative distortion (i.e. the displacement) at a corresponding part of the substrate. The position $P_2$ of a substrate mark on the back side of a wafer is therefore:

$$P_2 = P_{2i} + OCO + ITO \quad (1)$$

If the front-to-backside alignment optics reflect the image this can be incorporated simply by using a transform matrix IM.

Using the fact that for a reference substrate the distance between the position of the mark on the front side $Q_2$ and the position of a mark on the back side $P_2$ of the reference substrate WR is known, the image to object vector ITO can be calculated for a given point:

$$ITO = (P_{2i} - Q_2) * IM - (Q_2 - P_2) \quad (2)$$

as $(P_{2i} - Q_2)$ can be measured.

The reference substrate WR is then moved relative to the substrate table WT. In one example, the substrate table then moves to a lifting apparatus where the reference substrate WR is lifted while the substrate table WT is moved a small distance and the reference substrate WR is then replaced on the substrate table WT. As shown in FIGS. 3, 4a and 4b when the substrate table WT returns to its exposing station the displacement, $Q_2$ of the reference substrate WR is ascertained (by measuring the displacement of reference mark $Q_2$). The displacement of the image of $P_2$, $P_{2i}$ (and hence the estimate of the position of $P_2$) is also measured and using the equation $$P_2 = Q_2 + ITO + (P_{2i} + OCO - Q_2) * IM \quad (3)$$

rearranged to $$OCO = (P_2 - ITO - Q_2 + (Q_2 - P_{2i}) * IM) * IM^{-1} \quad (4)$$

the optical correction vector for that position can be calculated. This is repeated for a different position on the reference substrate WR. These vectors give an indication of the relative distortion of different areas of the substrate image. Therefore the more optical correction vectors found, the more accurate the estimation of the distortion of the entire substrate image. It may be desirable to calculate at least four optical correction vectors.

The optical correction vectors, OCO, are combined to form an optical correction array (OCA). Both the displacement vector, ITO, and the optical correction array, OCA are specific to the lithographic projection apparatus (or at least to the alignment optics), and are stored, as machine constants, for any future use of the apparatus. For example, such calibration information may be applied to calibrate a position of an alignment system and/or to correct an alignment measurement.

The vectors may be stored to corresponding locations of a data storage device (e.g. semiconductor RAM, flash RAM, or a magnetic and/or optical disk). Calculations and/or corrections as described herein may be performed by one or more processors and/or microcontrollers, each of which may be local or external and may also perform other tasks e.g. relating to operation of a lithographic apparatus.

It may be desirable to use a single, rather than a plurality of displacement vectors in such a method. The method may further comprise providing front-to-backside alignment optics for projecting an image of the substrate mark on the back side of the substrate to the front side of the substrate, wherein the alignment system uses the image.

It may be desirable to use a plurality of substrate marks. The more substrate marks there are, the more detailed and accurate analysis of the optics may be carried out. A method according to an embodiment of the invention may also comprise providing a reference substrate having a reference substrate mark, detecting the location of said mark and said reference substrate mark through the optics using the alignment system. The reference substrate is thus used for an initial calibration. The optics preferably include an implanted reference mark in the object window of the optics, which is used as a reference against which to measure relative changes. The optics are preferably front-to-backside alignment optics and a plurality of marks (either a plurality of substrate marks or the implanted reference mark and at least one substrate mark) are projected through each branch of the front-to-backside alignment optics.

For a substrate W in which the substrate marks on the front side are no longer accessible or usable, front-to-backside alignment optics are used. The position of an image of the substrate mark $P_2$ is processed to find the actual position of the substrate mark $P_2$ using the displacement vector, ITO, and the optical correction array, OCA to compensate for distortion by the front-to-backside alignment optics. The accurate position of the substrate mark $P_2$ can thus be ascertained.

For simplicity the first optical correction vector, OCO, can be subtracted from the second and subsequent optical correction vectors, OCO, to normalize the optical correction array OCA. Due to the smaller values, this has been found to speed up subsequent computation of the substrate position.

When using the optical correction array to align a substrate using a particular point, the nearest correction vector to the point is used. Alternatively interpolation can be used between at least two, preferably three or four of the nearest optical correction vectors, OCO.

At least some of the embodiments of the invention as disclosed herein can furthermore be used in conjunction with a system with any number of front-to-backside alignment optic branches.

To achieve optimal results this calibration should preferably be carried out periodically.

Additionally this development can be used to compensate for distortions in the other aspects of alignment such as errors in the alignment of alignment marks.

Although a through the lens alignment system has been used to illustrate the invention, an off-axis alignment system can equally be used.

Although embodiments of the invention have been illustrated using a Cartesian co-ordinate system, others such as a polar co-ordinate system can be used.

At least some methods as disclosed herein may include calculation of only a single ITO vector. As only one displacement vector needs to be calculated, it can be done with more accuracy. It may be desirable to repeat the operation of moving the reference substrate a plurality of times to generate a plurality of second correction vectors and an optical correction array thus generated. For example, it may be desirable to calculate at least four optical correction vectors.

For simpler calculation, the first correction vector may be subtracted from each second correction vector to normalize the optical correction array. Additionally or alternatively, in the operation of moving the reference substrate and generating a correction vector the displacement vector between the image of a point on the back side of the reference substrate and the point on the front side of the reference substrate may be subtracted from said correction vector. In one method, in the operation of moving the reference substrate and calculating a correction vector, the position of a point on the front side of the reference substrate corresponding to the point on the back side of the reference substrate is used.

The actual position of said mark on the back side of said reference substrate can be calculated using the measured position of a mark on the front side of said reference substrate.

Further embodiments of the invention are similar to those described above except for the details given below. Such embodiments can be used in combination with the optical correction vectors described above, or using another method of measuring the alignment i.e. with a plurality of image to object vectors.

Figure 5:
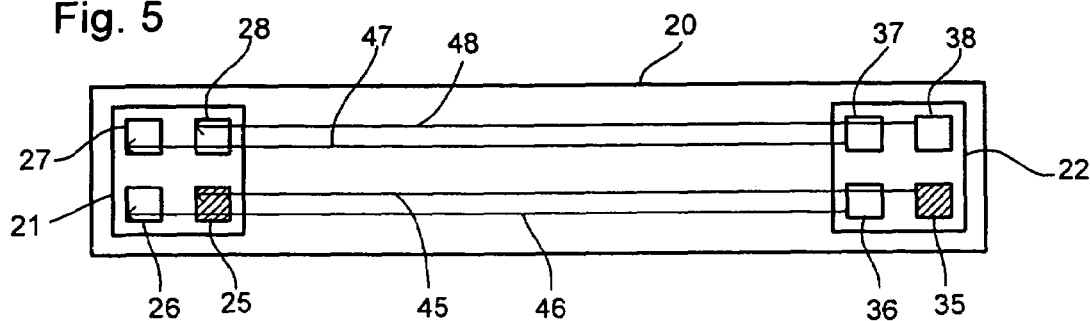
FIG. 5 shows a single branch front-to-backside alignment optics with a reference mark and substrate marks.

As shown in FIG. 5 each branch of the front-to-backside alignment optics 20 is sufficiently large to project at least two marks. Implanted in the object window 21 of each branch of the front-to-backside alignment optics 20 is a reference mark 25. Reference mark 25 may be etched, marked or glued into the object window of front-to-backside alignment optics 20. Instead of a single substrate mark 26 appearing in the object window 21 of the front-to-backside alignment optics 20, three substrate marks 26, 27, 28 are in the object window of the front-to-backside alignment optics 20. As can be seen, images 35, 36, 37, 38 of the marks 25, 26, 27, 28 are projected to the image window 22 of the front-to-backside alignment optics 20. Image to object vectors 45, 46, 47, 48 indicating the distance between the image and the mark are calculated for each mark 25, 26, 27, 28. These vectors are used as reference vectors, and changes in the characteristics of the front-to-backside alignment optics 20 are measured relative to them.

Figure 6:
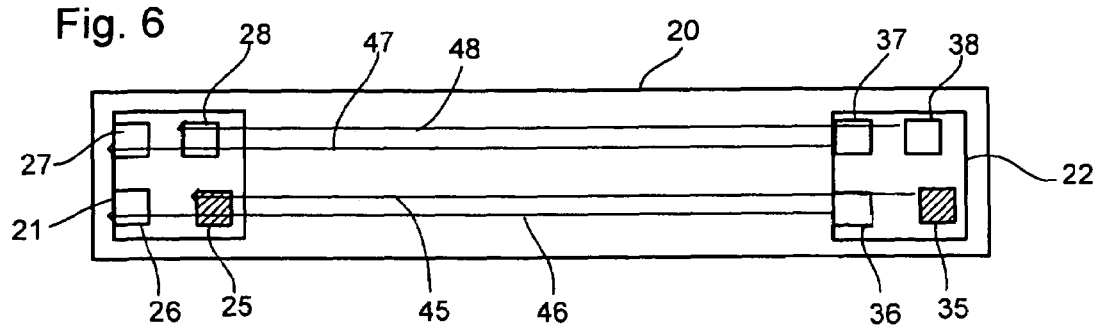
FIG. 6 shows a branch of front-to-backside alignment optics being used in detecting a shift in the optical branch of the front-to-backside alignment optics.

At a later time another substrate, also having substrate marks 26, 27, 28 printed in the same position on the substrate is placed on the substrate table WT. As can be seen in FIG. 6 the relative position of the image of the substrate marks 36, 37, 38 and the image of the reference mark 35 has changed. The position of the optical branch relative to the substrate W must therefore have been altered. Operations to correct this can therefore be taken.

Figure 7:
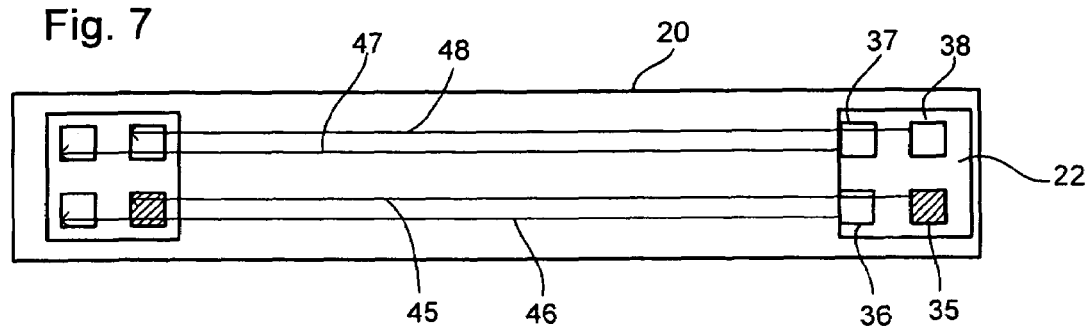
FIG. 7 shows a branch of front-to-backside alignment optics being used in detecting a change in a dimension of the branch of the front-to-backside alignment optics.

Another scenario is depicted in FIG. 7, where all the image to object vectors have changed. This indicates that at least one dimension of the branch of the front-to-backside alignment optics has been altered.

Figure 8:
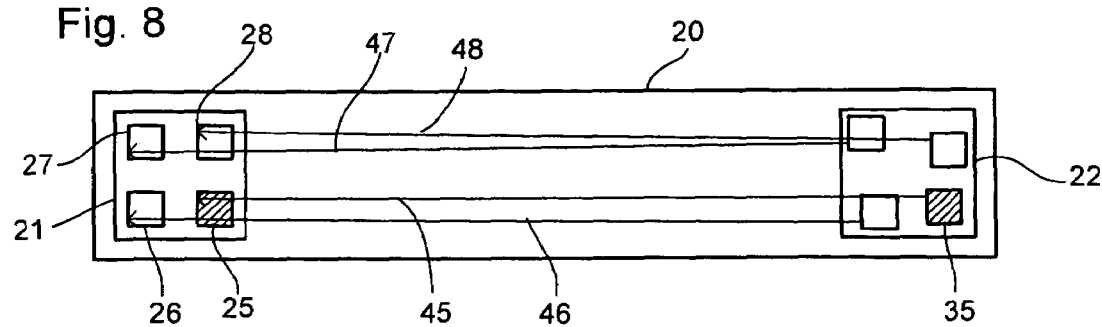
FIG. 8 shows a branch of front-to-backside alignment optics being used in detecting a change in the optical magnification of a branch of the front-to-backside alignment optics.

A third scenario is depicted in FIG. 8. Again, all the image to object vectors have changed. However, they have all changed by different amounts indicating that there has been a change in the magnification of this branch of the front-to-backside alignment optics 20.

Once these changes have been detected operations can be taken to compensate for them.

This method of alignment is particularly advantageous as it can be carried out using a normal substrate, no specific calibration operations are necessary. Although illustrated here using three substrate marks, a single substrate mark would be sufficient in at least some applications.

The recalculation of the displacement vector may thus allow detection of a change in the front-to-backside alignment optics e.g. a change in location, dimensions or magnification of the front-to-backside alignment optics. A plurality of marks may be projected through each branch of said front-to-backside alignment optics, resulting in more detailed information regarding the front-to-backside alignment optics. The more marks that are projected through each branch of the front-to-backside alignment optics, the more detailed may be the information.

It may also be desirable to include a mark implanted in the front-to-backside alignment optics. The relative position of the image (projected through the front-to-backside alignment optics) of marks arranged on the substrate and the image of the implanted mark may change, which would indicate a change in the location of the front-to-backside alignment optics relative to the substrate. Alternatively, if there is no change in the relative position of the image of the substrate marks and the image of the implanted mark, there may be a change in the dimensions or magnification of the front-to-backside alignment optics. A reference substrate having a plurality of (substrate) marks on the back side may be used for the calibration.

The front-to-backside alignment optics may be sufficiently large to simultaneously project a plurality of marks through each branch. A reference mark is implanted in the object window of the front-to-backside alignment optics and a relative change in the position of the images of the reference mark and substrate mark projected through a single branch of the front-to-backside alignment optics can indicate a change in the optical characteristics of the front-to-backside alignment optics.

A lithographic projection apparatus according to an embodiment of the invention may include front-to-backside alignment optics arranged to project an image of the substrate mark to the front side of the substrate wherein the front-to-backside alignment optics are sufficiently large to simultaneously project a plurality of marks including the substrate mark.

The front-to-backside alignment optics may have a mark implanted in the object window which is projected, together with the substrate mark through the front-to-backside alignment optics. The image in the image plane of the front-to-backside alignment optics thus comprises an image of the implanted mark and an image of the substrate mark. These images may be used for the alignment.

It may be desirable for the front-to-backside alignment optics to project an area of approximately 5 $mm^2$. For example, the object window may be of circular shape with a diameter of 1.2 mm or rectangular, with sides of 1.4 mm and 3 mm.

Whilst specific embodiments of the invention have been described above, it will be appreciated that the invention may be practiced otherwise than as described. Embodiments of the invention also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

Although specific reference may be made in this text to the use of an apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

What is claimed is:

1. A method of calibrating a lithographic apparatus, the method comprising:
    calculating a displacement vector between (a) a position of a mark on a back side of a reference substrate as observed through a front-to-backside alignment optics of the lithographic apparatus and (b) an actual position of said mark;
    moving the reference substrate a small distance relative to said front-to-backside alignment optics and comparing a resulting displacement of an image of a point on the back side of the reference substrate to a resulting displacement of a point on the front side of the reference substrate to generate a first correction vector;
    repeating said moving and comparing for a different point on the reference substrate to generate a second correction vector; and
    applying calibration information based on the displacement vector and the first and second correction vectors.

2. The method according to claim 1, said method comprising:
    repeating said moving and comparing for a plurality of different points on the reference substrate to generate a corresponding plurality of second correction vectors, and
    generating an optical correction array based on the correction vectors.

3. The method according to claim 2, wherein generating an optical correction array includes subtracting the first correction vector from each second correction vector.

4. The method according to claim 2, wherein said generating an optical correction array is based on at least four correction vectors.

5. The method according to claim 1, wherein said moving and comparing includes subtracting the displacement vector from said correction vector.

6. The method according to claim 1, wherein said point on the front side of the reference substrate corresponds to the point on the back side of the reference substrate.

7. The method according to claim 1, wherein the actual position of said mark on the back side of said reference substrate is calculated based on a measured position of a mark on the front side of said reference substrate.

8. A method of calibrating a lithographic apparatus, the method comprising:
    for each of a plurality of marks arranged to be observed through a single branch of front-to-backside alignment optics of the lithographic apparatus, calculating a first displacement vector between (a) the mark and (b) an image of the mark observed in an image window of said front-to-backside alignment optics;
    for each of the plurality of marks, calculating a second displacement vector between (a) the mark and (b) an image of the mark observed in an image window of said front-to-backside alignment optics subsequent to said calculating a first displacement vector; and
    comparing the first and second displacement vectors to detect a change in the front-to-backside alignment optics.

9. The method according to claim 8, wherein one of said plurality of marks is fixed within said front-to-backside alignment optics.

10. The method according to claim 8, wherein at least one of said plurality of marks is on the back side of a reference substrate.

11. The method according to claim 8, said method further comprising determining a shift in the single branch based on said comparing.

12. The method according to claim 8, said method further comprising determining a change in at least one dimension of said front-to-backside alignment optics based on said comparing.

13. The method according to claim 8, said method further comprising determining a change in an optical magnification of said front-to-backside alignment optics based on said comparing.

14. An alignment method comprising:
    providing an alignment beam of radiation; and
    providing an alignment system for projecting the alignment beam onto a substrate mark on the back side of a substrate and detecting said substrate mark,
    wherein a position of the substrate mark is calculated using a displacement vector and a plurality of correction vectors.

15. An alignment method according to claim 14, further comprising using front-to-backside alignment optics to project an image of said substrate mark on the back side of said substrate to the front side of said substrate,
    wherein said alignment system is arranged to detect said substrate mark based on said image.

16. The alignment method according to claim 14, said method further comprising:
    using a radiation system to provide a beam of radiation;
    using patterning structure to endow the beam of radiation with a pattern in its cross-section;
    projecting the patterned beam of radiation onto a target portion of a layer of radiation-sensitive material that at least partially covers a substrate.

17. A data storage medium storing machine-executable instructions that describe a method comprising:
    calculating a displacement vector between (a) a position of a mark on a back side of a reference substrate as observed through a front-to-backside alignment optics of the lithographic apparatus and (b) an actual position of said mark;

moving the reference substrate a small distance relative to said front-to-backside alignment optics and comparing a resulting displacement of an image of a point on the back side of the reference substrate to a resulting displacement of a point on the front side of the reference substrate to generate a first correction vector;

repeating said moving and comparing for a different point on the reference substrate to generate a second correction vector; and applying calibration information based on the displacement vector and the optical correction vectors.

18. A lithographic apparatus comprising:

a radiation system configured to provide a beam of radiation;

a support structure configured to support patterning structure, the patterning structure serving to pattern the beam of radiation according to a desired pattern;

a substrate table configured to hold a substrate;

a projection system arranged to project the patterned beam onto a target portion of the substrate;

an alignment system arranged to detect alignment between a reference mark and said substrate mark using an alignment beam of radiation and front-to-backside alignment optics;

a storage device arranged to store a displacement vector and a plurality of correction vectors; and a correction device arranged to correct an alignment error of the substrate.

19. The lithographic apparatus according to claim 18, wherein the displacement vector is based on an image observed through the front-to-backside alignment optics.

20. The lithographic apparatus according to claim 18, wherein the correction device is configured to correct an alignment error based on the displacement vector and the plurality of correction vectors.

21. A lithographic projection apparatus comprising:

a radiation system configured to provide a beam of radiation;

a support structure configured to support patterning structure, the patterning structure serving to pattern the beam of radiation according to a desired pattern;

a substrate table configured to hold a substrate;

a projection system arranged to project the patterned beam onto a target portion of the substrate;

front-to-backside alignment optics arranged to project an image of said substrate mark to the front side of said substrate; and an alignment system arranged to detect alignment between a reference mark and said substrate mark using an alignment beam of radiation and said front-to-backside alignment optics, wherein said front-to-backside alignment optics is configured to simultaneously project images of a plurality of marks including said substrate mark.

22. The lithographic apparatus according to claim 21, wherein an object window of the front-to-backside alignment optics has a diameter of at least one millimeter.

23. The lithographic apparatus according to claim 21, wherein an object window of the front-to-backside alignment optics has a width of at least one millimeter.

24. The lithographic apparatus according to claim 21, wherein said front-to-backside alignment optics is configured to project, together with an image of the substrate mark, an image of a mark implanted into an element of the front-to-backside alignment optics.

* * * * *